United States Patent [19]
Eklund

[11] Patent Number: 6,114,734
[45] Date of Patent: Sep. 5, 2000

[54] TRANSISTOR STRUCTURE INCORPORATING A SOLID DEUTERIUM SOURCE FOR GATE INTERFACE PASSIVATION

[75] Inventor: Robert H. Eklund, Plano, Tex.

[73] Assignee: Texas Instruments Incorporated, Dallas, Tex.

[21] Appl. No.: 09/120,661

[22] Filed: Jul. 22, 1998

Related U.S. Application Data

[60] Provisional application No. 60/053,941, Jul. 28, 1997.

[51] Int. Cl.⁷ .......................... H01L 29/76; H01L 29/04; H01L 31/062; H01L 31/113; H01L 31/119
[52] U.S. Cl. .............................. 257/410; 257/56; 257/58; 257/62; 438/473; 438/475
[58] Field of Search ................................ 257/58, 56, 62, 257/410; 438/471–477

[56] References Cited

U.S. PATENT DOCUMENTS

| | | | |
|---|---|---|---|
| 3,923,559 | 12/1975 | Sinha | 148/1.5 |
| 4,753,896 | 6/1988 | Matloubian | 437/29 |
| 5,510,631 | 4/1996 | Saito et al. | 257/77 |
| 5,821,594 | 10/1998 | Kasai | 257/410 |
| 5,872,387 | 2/1999 | Lyding et al. | 257/607 |
| 5,936,300 | 8/1999 | Sasada et al. | 257/632 |

FOREIGN PATENT DOCUMENTS 410092956  4/1998  Japan .

OTHER PUBLICATIONS

"The Combined Effects of Deuterium Anneals and Deuterated Barrier–Nitride Processing on Hot–Electron Degradation in MOSFET's", IEEE Transactions on Electron Devices, vol. 46, No. 4, Apr. 1999, pp. 747–753.

IEEE Electron Device Letters, vol. 18, No. 3, Mar. 1977, "Deuterium Post–Metal Annealing of MOSFET's for Improved Hot Carrier Reliability", pp. 81–83 (I.C. Kizilyalli, J.W. Lyding and K. Hess).

Appl. Phys. Lett. 68 (18), Apr. 29, 1996, "Reduction of Hot Electron Degradation in Metal Oxide Semiconductor Transistors by Deuterium Processing", pp. 2526–2528 (J.W. Lyding, K. Hess and I.C. Kizilyalli).

J. Vac. Sci. Technol. A 13(3), May/Jun. 1995, "Fourier Transform Infrared Study of Rapid Thermal Annealing of a–Si:N:H(D) Films Prepared by Remote Plasma–Enhanced Chemical Vapor Deposition", pp. 607–613 (Z. Lu, P. Santos–Filho, G. Stevens, M.J. Williams and G. Lucovsky).

Appl. Phys. Lett. 57 (11), Sep. 10, 1990, "Annealing Behavior of GaAs Implanted With Si+ and SiF+ and Rapid Thermally Annealed With Plasma–Enhanced Chemical Vapor Deposited Silicon Nitride Cap", pp. 1129–1131 (J.P. de Souza, D.K. Sadana, H. Baratte and F. Cardone).

Appl. Phys. Lett. 63 (11), Sep. 13, 1993, "Passivation and Depassivation of Silicon Dangling Bonds at the $Si/SiO_2$ Interface by Atomic Hydrogen", pp. 1510–1512 (E. Cartier, J.H. Stathis and D.A. Buchanan).

(List continued on next page.)

Primary Examiner—David Hardy
Assistant Examiner—Allan R. Wilson
Attorney, Agent, or Firm—Jacqueline J. Garner; Wade James Brady III; Frederick J. Telecky, Jr.

[57] ABSTRACT

The present invention is a method for improving transistor channel hot carrier reliability by incorporating a solid deuterium source into the transistor structure. This is accomplished by using a deuterium containing source gas for formation of components of the transistor structure. A deuterium sinter, shown to improve channel hot carrier lifetime, is made a more viable process step by using deuterium as a source gas for formation of components made of silicon nitride. Additionally, time and/or temperature of the sinter may reduced. Incorporation of deuterium containing components which allow sufficient outdiffusion of deuterium may eliminate the need for a final deuterium sinter.

15 Claims, 3 Drawing Sheets

OTHER PUBLICATIONS

J. Appl. Phys. 59 (2), Jan. 15, 1986, "Hydrogen in Low–Pressure Chemical–Vapor–Deposited Silicon (oxy) Nitride Films", pp. 447–453 (F.H.P.M. Habraken, R.H.G. Tijhaar, W.F. van der Weg, A.E.T. Kuiper and M.F.C. Willemsen).

Dec.1991 IOP Publishing Ltd, "Diffusion of Hydrogen in and Into LPCVD Silicon Oxynitride Films", pp. 191–194 (H.C.M. Marce, W.M. Arnold Bik and F.H.P.M. Habraken).

Dec. 1993 The American Physical Society, Physical Review B, vol. 48, No. 8, "Dynamic Behavior of Hydrogen in Silicon Nitride and Oxynitride Films Made by Low–Pressure Chemical Vapor Deposition", pp. 5444–5456 (W.M. Arnoldbik, C.H.M. Marce, A.J.H. Maas, M.J. vanden Boogaard, F.H.P.M. Habraken and A.E.T. Kuiper).

Applied Surface Science 39 Dec.(1989), North Holland, Amsterdam, "The Effect of Hydrogen on Hot Carrier and Radiation Immunity of MOS Devices", pp. 511–522 (Yoav Nissan–Cohen).

TRANSISTOR STRUCTURE INCORPORATING A SOLID DEUTERIUM SOURCE FOR GATE INTERFACE PASSIVATION

This application claims priority under 35 USC § 119 (e) (1) of provisional application No. 60/053,941, filed Jul. 28, 1997.

BACKGROUND AND BRIEF DESCRIPTION OF THE PRIOR ART

The present invention relates to fabrication of MOS transistors with reduced susceptibility to channel hot carrier effects.

Hydrogen passivation of the dangling bonds which form electrically active interface traps improves device function, but hydrogen passivation can be degraded by subsequent hot electron impact. Recent results have shown that passivation with deuterium instead of hydrogen in the post-metal anneal process is more stable and therefore less likely to succumb to hot electron degradation, resulting in an improvement in channel hot carrier lifetime of 10–100X. I.C. Kizilyalli et al., "Deuterium Post-Metal Annealing of MOSFET's for Improved Hot Carrier Reliability," 18 *IEEE Electron Device Letters*, 81 (1997); J. W. Lyding et al., "Reduction of Hot Electron Degradation in Metal Oxide Semiconductor Transistors by Deuterium Processing," 68 *Appl. Phys. Lett.* 18 (1996), which are hereby incorporated by reference.

However, the deuterium sinter has been found not to work as well on devices which have silicon nitride sidewall spacers. This unworkability is believed to be due to the nitride spacer acting as a post-deposition source of hydrogen. Any hydrogen incorporated during deposition may become a post-deposition hydrogen source by outdiffusion from the film during high temperature treatments such as sintering. A post-deposition hydrogen source can passivate the dangling bonds before a final deuterium sinter is able to. Additionally, silicon nitride blocks deuterium diffusion. This can be a problem when silicon nitride is used as the etch-stop layer during the formation of self-aligned contact holes. Deuterium passivation of the gate interface in such a structure proceeds very slowly.

BRIEF DESCRIPTION OF THE PRIOR ART

The present invention substitutes a deuterated source gas in the formation of one or more components, such as nitride sidewall spacers, which would otherwise be formed using a hydrogen-containing source gas. Use of a deuterium containing rather than hydrogen-containing source gas results in incorporation of deuterium from the source gas during deposition. Materials thus made can act as a solid deuterium source for deuterium passivation of the gate interface.

The advantages of having a transistor structure incorporating a solid deuterium source include:
improving deuterium passivation for transistor structures containing silicon nitride components
reducing sintering time
reducing sintering temperature
optionally eliminating the sintering step by incorporating into the transistor structure a sufficient deuterium source for passivation
improving hot-channel-carrier reliability.

BRIEF DESCRIPTION OF THE DRAWING

The disclosed inventions will be described with reference to the accompanying drawings, which show preferred sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of a Structure Incorporating a Solid Deuterium Source

Figure 1:
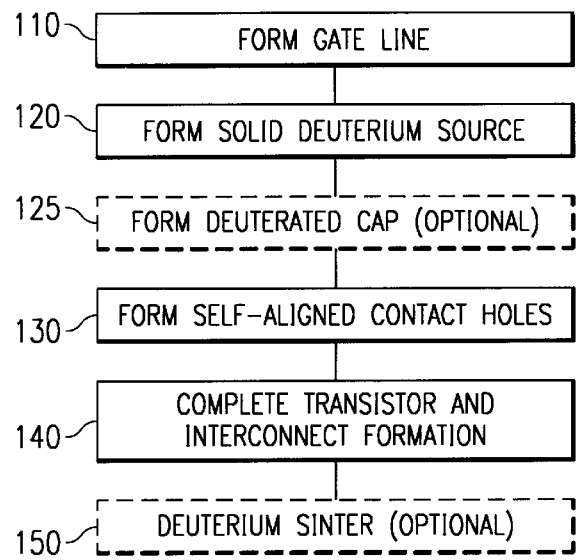
FIG. 1 shows a process flow for fabricating a gate structure.
Figure 3:
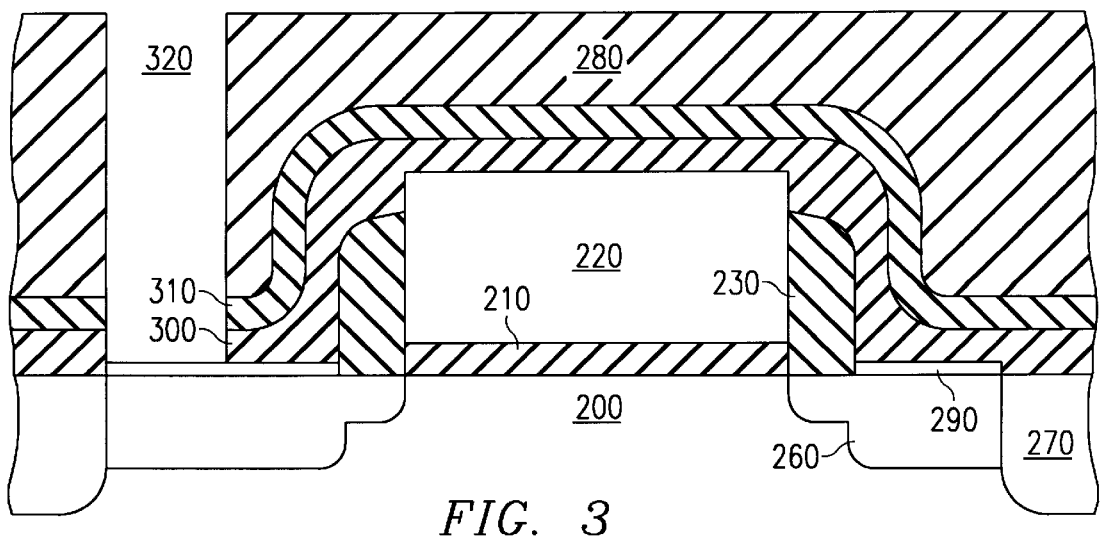
FIG. 3 shows a gate structure with self-aligned contact holes.

FIG. 1 is a process flow for forming a transistor structure incorporating a solid deuterium source such as the sample transistor structure shown in FIG. 3. The steps in FIG. 1 will now be discussed in an overview of the disclosed invention. Details of the structure in FIG. 3 and specific examples are discussed below in a sample embodiment.

The structure in FIG. 3 shows a gate dielectric 210 formed over a semiconductor active area 200. Shallow trench isolation structures 270 and gate 220 are formed to define the location of source/drain (S/D) regions 260. This completes Step 110.

Using a deuterium-containing source gas, various components of a transistor structure (such as sidewall spacers 230) may be formed as the solid deuterium source to complete Step 120. Specific examples will be discussed below in a sample embodiment.

Once a solid deuterium source is formed at Step 120, contact holes 320 as shown in FIG. 3 may be formed using a self-aligned contact process. In this process, a silicide layer 290 is formed on the semiconductor active area adjacent to the sidewall spacers 230. The metal layer may or may not be formed in a deuterium ambient. An optional first dielectric layer 300, which may or may not be deuterated, is then formed over and across the entire wafer. A thin deuterated silicon nitride layer 310 is then deposited over the first dielectric layer and across the entire wafer to serve as an etch-stop when contact holes are formed later. An interlevel oxide layer 280, which may or may not deuterated, is then deposited over the nitride layer. The contact hole 320 to silicide layer 290 is formed by selective etches. This completes Step 130.

Fabrication of other poly levels and interconnects proceeds conventionally to a completed gate structure at step 140. Deuterium may continue to be used through step 140 to form any additional components which would ordinarily be formed with hydrogen.

Finally, a deuterium sinter may be used at optional step 150 to achieve good metal to semiconductor contact and to passivate any dangling bonds at the gate interface.

Sample Embodiment

Details and specific examples of the steps in the process flow of FIG. 1 will now be discussed in conjunction with FIGS. 2–3, which show various stages in the formation of a sample embodiment.

Figure 2:
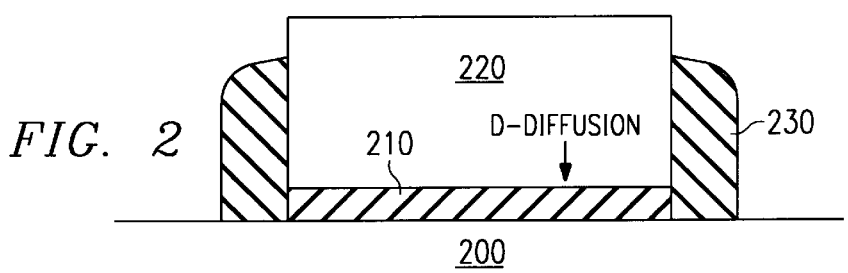
FIG. 2 shows a gate structure with deuterated sidewall spacers.

Referring to FIG. 2, gate oxide 210 has been formed over a semiconductor active area 200. The gate oxide 210 is preferably grown dry so that it acts as a deuterium target, not a deuterium source. In the sample embodiment shown in FIG. 2, deuterated nitride sidewall spacers 230 have been formed as the solid deuterium source. The sidewall spacers are formed using 1000 sccm of $ND_3$ plus 100 sccm of $SiH_2Cl_2$. The ratio of $SiH_2Cl_2/ND_3$ in this sample embodiment is 1:10. The nitride deposition is preferably accomplished under a total pressure of 200 mTorr for 1875 seconds at 700–800 (preferably 750) degrees Celsius, with a resulting film thickness of 100 nanometers and a composition of $Si_3N_4$, plus a small percentage of deuterium.

Contact holes 320 as shown in FIG. 3 were formed using a self-aligned contact process. In this process, silicide layer 290 was formed on the semiconductor active area adjacent to the sidewall spacers 230. TEOS layer 300 was formed over and across the entire wafer as the first dielectric layer. A thin (80–500 nanometers) deuterated silicon nitride layer 310 was then deposited over the TEOS layer and across the entire wafer. A BPSG (borophosphosilicate glass) interlevel oxide layer 280, was then deposited over the nitride layer. Contact hole 320 was formed by using a contact etch selective to nitride. The etch proceeded through BPSG layer 280, but stopped when it reached nitride layer 310. Nitride layer 310 and TEOS layer 300 were then etched through to silicide layer 290 to complete formation of contact hole 320. Using a deuterated silicon nitride layer 310 provides a solid deuterium source as well as prevents nitride layer 310 from acting as a barrier for deuterium diffusion.

Fabrication proceeded conventionally to a completed transistor structure. The structure was then sintered in 100% deuterium for 30–120 min (preferably 30), at a temperature of 350–480 C. (preferably 450 C., or 400 C. for use with temperature sensitive low-k dielectrics).

Alternative Embodiment: Deuterated Polysilicon Gate

Figure 8:
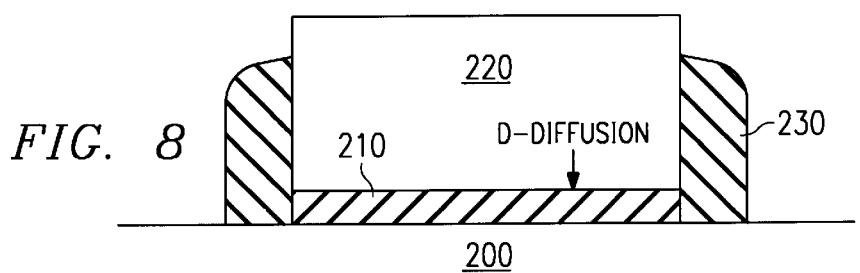
FIG. 8 shows a gate structure with a deuterated transistor gate.

Rather than having sidewall spacers as the solid deuterium source as in the sample embodiment, gate 220 shown in FIG. 8 may be deuterated polysilicon. The benefit of using polysilicon is that the polysilicon gate would be a significant deuterium source because the diffusivity rate of deuterium in polysilicon is high. Other conditions remain like those above.

Alternative Embodiment: Deuterated Cap

Figure 4:
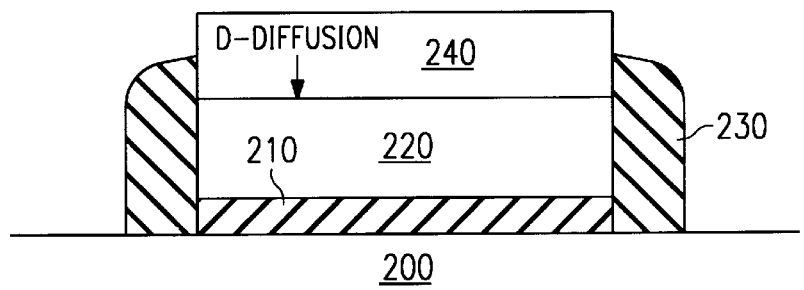
FIG. 4 shows a gate structure with a deuterated cap.

Referring to FIG. 4, a deuterated nitride cap 240 may be formed as a solid deuterium source and to act as a hard mask. In this embodiment, the nitride cap acts as a source of deuterium, rather than blocking deuterium diffusion to the gate interface. If a cap is present, a silicide layer will not be formed over the gate, but will only form where silicon is exposed. Other conditions remain like those stated above. This completes optional Step 125.

Alternative Embodiment: Deuterated Pad Oxide

Figure 5:
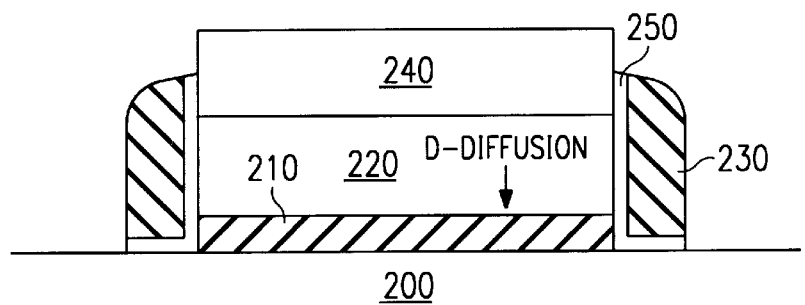
FIG. 5 shows a gate structure with deuterated pad oxides adjacent to a transistor gate and under a sidewall spacer.

As shown in FIG. 5, deuterated pad oxides 250 may be formed adjacent to the gate 220 and under the sidewall spacers 230 to provide an additional solid deuterium source. The pad oxide would be formed by a wet oxidation using deuterated water. Other conditions remain like those above.

Alternative Embodiment: Deuterated STI Structures

Figure 6:
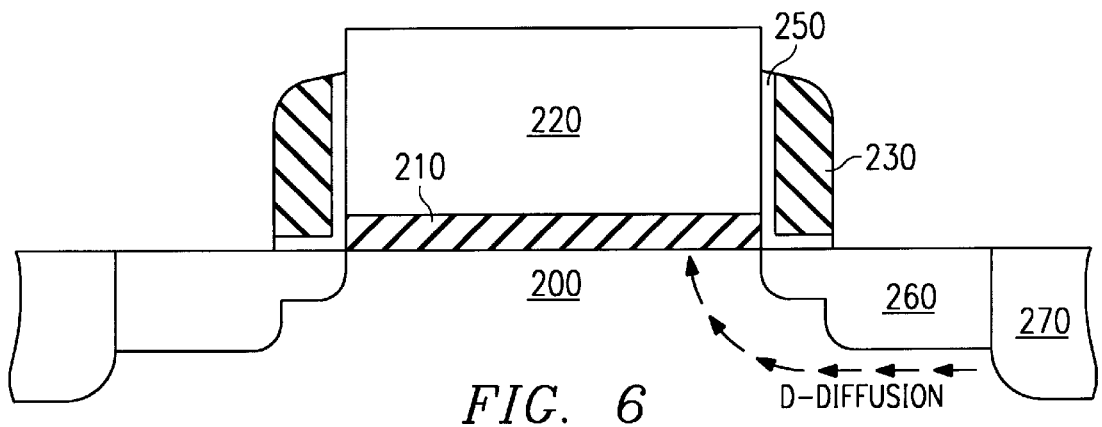
FIG. 6 shows a shallow trench isolation structure with a deuterated field oxide.

FIG. 6 shows shallow trench isolation (STI) structures 270 formed with a deuterated trench-fill dielectric. The STI structures may be formed in a variety of ways. For example, diffusion from raised source/drain regions, diffusion from an overlying layer such as polysilicon-germanium or doped oxide, gas-immersion laser doping, or other techniques designed to keep these regions shallow may be used. Deuterium may be used where appropriate in the chosen technique. Alternatively, the trench may be formed on the semiconductor active area, then a deuterated thermal oxide may be grown on the trench surface to round the trench corners. A deuterated oxide then may be used as the trench-fill dielectric.

Alternative Embodiment: Deuterated Field Oxide

If a grown field oxide, rather than a shallow trench isolation structure is desired, the field oxide may be grown using deuterated water to provide the steam used in the process. A field oxide so formed would act as deuterium source similar to STI structure 270 shown in FIG. 6. Other conditions remain like those above.

Alternative Embodiment: Borophosphosilicate Glass (BPSG)

Figure 7:
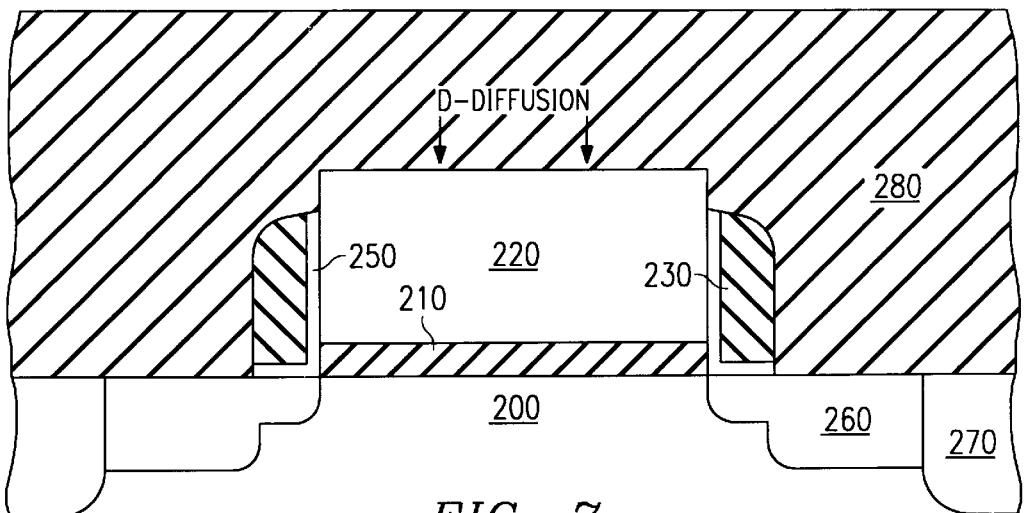
FIG. 7 shows a gate structure with a deuterated BPSG oxide layer.

FIG. 7 shows a deuterated BPSG interlevel oxide layer 280 which was formed for the self-aligned contact hole process at step 130. BPSG is chemical-vapor-deposited silicon dioxide which is heavily doped with boron and phosphorous. BPSG may be used to achieve planarization, particularly when multiple layers form the transistor structure. Any hydrogen containing source gas used during the BPSG process may be replaced with a deuterium containing source gas. Other conditions remain like those above.

Alternative Embodiment: No Sinter

In a contemplated alternative embodiment, incorporation of deuterium into the transistor structure may eliminate the need for a deuterium sinter if the deuterium is incorporated into materials which allow out-diffusion of deuterium in a sufficient amount. This is particularly advantageous with low temperature dielectrics which do not permit use of conventional sintering steps. Other conditions remain like those above.

Alternative Embodiment: Partially Deuterated Sinter

Note that the sinter used in optional step 150 does not have to be totally hydrogen free. In practice, significant benefits are predicted with a deuterium/hydrogen ratio of more than 1%, but preferably greater than a 1:10 ratio, and even more preferably greater than 1:1. The more significantly deuterated the ambient, the less time is required to sinter, however, a more deuterated gas is more expensive than a lesser deuterated one. The deuterium concentration chosen depends on the particular application and trade-offs. Other conditions remain like those stated above.

Alternative Embodiment: Deuterated $SiH_2Cl_2$ Source Gas

Deuterated dicholorosilane may be used as an alternative source gas instead of hydrogen-containing dichlorosilane, as in the sample embodiment. Other conditions remain like those stated above.

Alternative Embodiment: Partially Deuterated Source Gas

Note that the source gas used in Step 120 does not have to be totally hydrogen free. In practice, benefits can be obtained with a deuterium/hydrogen ratio of more than 1%, but preferably greater than a 1:2 ratio, even more preferably greater than 1:1. The more significantly deuterated the source gas, the more deuterium will be available from the transistor component (e.g. sidewall spacers). However, a more deuterated source gas is more expensive than a lesser deuterated one. The deuterium concentration chosen depends on the particular application and trade-offs. Other conditions remain like those stated above.

Alternative Embodiment: Power During Deposition

An RF voltage may be applied in combination with deuterium containing source gases to achieve plasma-enhanced chemical vapor deposition (PECVD) of materials such as silicon dioxide or silicon nitride. Substitution of hydrogen containing source gases with deuterium containing source gases is particularly advantageous for PECVD deposited materials because of the substantial amount of hydrogen incorporated from the source gas. Other conditions remain like those stated above.

Alternative Embodiment: SiGe Active Area

Note that a SiGe semiconductor active area 200 rather than the Si semiconductor active area 200 may be used. Other conditions remain like those stated above.

Alternative Embodiment: Nitrided Gate Dielectric

Note that a nitrided gate dielectric 210 may be used. Other conditions remain like those stated above.

Alternative Embodiment: TFI or Other 3D Structures

Figure 9:
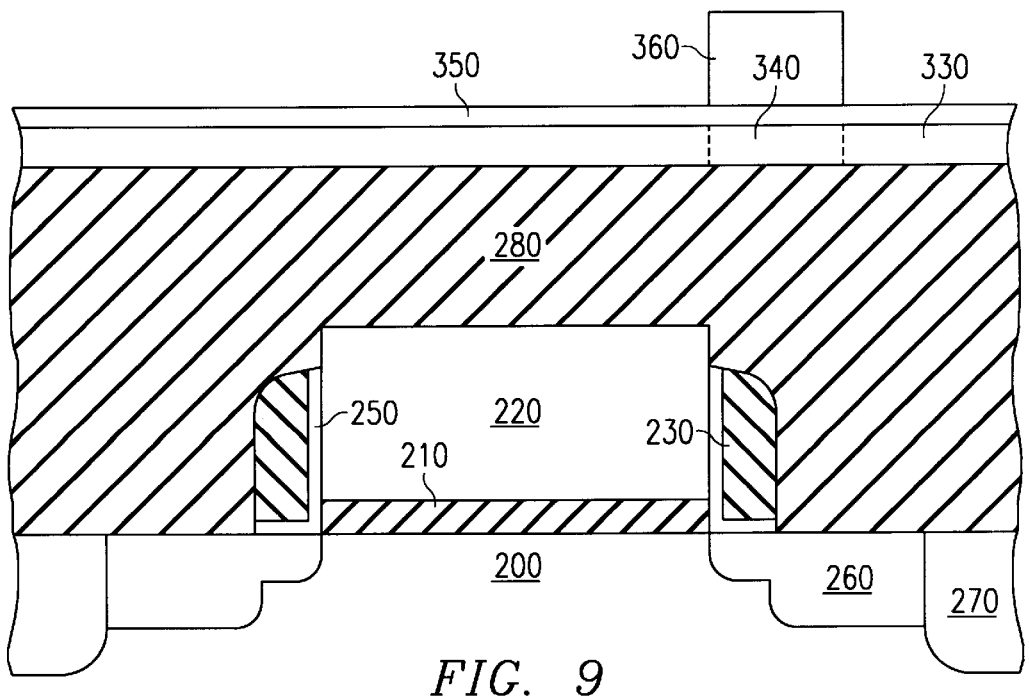
FIG. 9 shows a thin film transistor structure.

Referring to FIG. 9, a thin film transistor may be formed on any of the structures previously discussed. A thin film (preferably 10–500 nanometers) of polysilicon is deposited over an interlevel BPSG oxide layer 280 which may or may not be deuterated. Patterned implants are used to form n– polysilicon 330 and p– polysilicon 340. A thin film dielectric 350 (preferably 10–100 nanometers of an "ONO" dielectric) is then formed over p– polysilicon 340 and across the entire wafer structure. N+ polysilicon layer 360 is formed over thin film dielectric layer 350 by blanket deposition followed by a photoresist, followed by removal of the exposed n+ polysilicon to leave n+ polysilicon 360. N– polysilicon 330 and/or p– polysilicon 340 and or thin film dielectric 350 and/or n+ polysilicon 360 may be formed using a deuterium containing source gas.

Alternative Embodiment: Silicon Oxynitride Sidewall Spacers

Other suitable materials, such as silicon oxynitride, may be deuterated and used to form the sidewall spacers.

Alternative Embodiment: Plasma Nitride Passivation

It has been observed that gate oxides of MOSFET's passivated by plasma silicon nitride have a higher hydrogen content, and therefore are more susceptible to hot channel carrier degradation. See e.g., Yoav Nissan-Cohen, "The Effect of Hydrogen on Hot Carrier and Radiation Immunity of MOS Devices," 39 *Applied Surface Science* 511 (1989), which is hereby incorporated by reference. In this alternative embodiment, structures would be passivated with deuterated silicon nitride. This would avoid the higher hydrogen content associated with hydrogen-containing plasma nitride passivation, thereby reducing hot channel carrier susceptibility.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. A partially fabricated transistor structure, comprising:

a semiconductor active area;

a transistor gate separated from said semiconductor active area by a gate dielectric;

a gate interface, between said semiconductor active area and said gate dielectric; and a portion of said transistor structure containing at least one solid deuterium source for deuterium diffusion disposed within said transistor structure, said solid deuterium source having a deuterium-hydrogen ratio of at least 5%.

2. The transistor structure of claim 1, further comprising:

a silicide layer formed over said semiconductor active area;

a deuterated silicon nitride layer formed over said silicide layer;

an interlevel oxide layer formed over said nitride layer; and contact holes formed in said oxide layer.

3. The transistor structure of claim 2, wherein: said interlevel oxide layer is deuterated.

4. The transistor structure of claim 2, wherein: said silicide layer is deuterated.

5. The transistor structure of claim 1 wherein said portion of said transistor structure includes additional portions not a part of said interface and containing said solid deuterium source.

6. The transistor structure of claim 5 wherein said additional portions are one or more of a sidewall insulator on said transistor gate, a cap over said gate and a transistor isolation region.

7. The transistor structure of claim 1 wherein said at least one solid deuterium source for deuterium diffusion disposed within said transistor structure is a nitride structure.

8. The transistor structure of claim 5 wherein said at least one solid deuterium source for deuterium diffusion disposed within said transistor structure is a nitride structure.

9. The transistor structure of claim 6 wherein said at least one solid deuterium source for deuterium diffusion disposed within said transistor structure is a nitride structure.

10. The transistor structure of claim 1 wherein said solid deuterium source is fabricated as a part of said portion of said transistor structure.

11. The transistor structure of claim 5 wherein said solid deuterium source is fabricated as a part of said portion of said transistor structure.

12. The transistor structure of claim 6 wherein said solid deuterium source is fabricated as a part of said portion of said transistor structure.

13. The transistor structure of claim 7 wherein said solid deuterium source is fabricated as a part of said portion of said transistor structure.

14. The transistor structure of claim 8 wherein said solid deuterium source is fabricated as a part of said portion of said transistor structure.

15. The transistor structure of claim 9 wherein said solid deuterium source is fabricated as a part of said portion of said transistor structure.

* * * * *